United States Patent [19]
Bockhaus et al.

[11] Patent Number: 5,644,609
[45] Date of Patent: Jul. 1, 1997

[54] APPARATUS AND METHOD FOR READING AND WRITING REMOTE REGISTERS ON AN INTEGRATED CIRCUIT CHIP USING A MINIMUM OF INTERCONNECTS

[75] Inventors: John W. Bockhaus; Gregg B. Lesartre; Gregory L. Ranson, all of Fort Collins, Colo.

[73] Assignee: Hewlett-Packard Company, Palo Alto, Calif.

[21] Appl. No.: 690,466

[22] Filed: Jul. 31, 1996

[51] Int. Cl.$^6$ .................................... G11C 19/00
[52] U.S. Cl. .................................... 377/64; 377/54
[58] Field of Search .................................... 377/54, 64

[56] References Cited

U.S. PATENT DOCUMENTS

| | | | |
|---|---|---|---|
| 4,648,105 | 3/1987 | Priebe et al. | 377/64 |
| 5,134,638 | 7/1992 | Stephens et al. | 377/64 |

Primary Examiner—Margaret Rose Wambach
Attorney, Agent, or Firm—Kevin M. Hart

[57] ABSTRACT

A method and apparatus is disclosed for reading data from and writing data to remote registers that are dispersed throughout an integrated circuit chip. Regardless of the size or number of remote registers involved, the operation is accomplished using only two interconnect lines, plus a clock. Each remote register is associated with a unique address. During a write operation, a microprocessor loads the write data into a staging register, loads the destination address into a header generation register along with a read/write control bit, and loads a count value into a clock. Thereafter, the apparatus of the invention proceeds automatically, as the clock counts down, to shift the data onto a serial data line following a header. Each of the remote registers in the system are arranged serially, and each monitors the header information, comparing the address contained in the header with its own address. In the event of a match, the remote register selected is enabled to shift data serially into itself from the serial data line. During a read operation, the selected remote register shifts its data out onto the serial data line. The read data is ultimately shifted back into the staging register.

4 Claims, 9 Drawing Sheets

APPARATUS AND METHOD FOR READING AND WRITING REMOTE REGISTERS ON AN INTEGRATED CIRCUIT CHIP USING A MINIMUM OF INTERCONNECTS

FIELD OF THE INVENTION

This invention relates to digital integrated circuits, and more particularly to an apparatus and method for accessing numerous remote registers on an integrated circuit chip using a minimum of interconnects between the registers.

BACKGROUND

During the design of complex integrated circuits, such as state-of-the-art microprocessors, the question of whether to implement secondary functionality on-chip sometimes turns on whether sufficient "real estate" would remain available on the silicon die after the primary functionality has been implemented. For example, while general purpose registers, a floating point unit and a bus interface would represent primary functionality in a microprocessor, on-chip self-diagnostic circuitry would represent secondary functionality. Thus, the question of whether to include the self-diagnostic circuitry may depend on available space.

One particular problem with the addition of secondary functionality in a digital design, especially self-diagnostic circuitry, is that it frequently involves placing numerous additional registers at widely separated locations around the chip. Not only do the registers themselves take up chip space, but so do the interconnect traces that are required to access them. Moreover, the interconnect traces must be routed in a manner that does not interfere with interconnect traces that are associated with the chip's primary functionality. This problem is felt more severely as the remote registers associated with secondary functionality become larger and more numerous. For example, if thirty-two self-diagnostic registers, each sixty-four bits wide, were placed at various locations within the functional blocks of a microprocessor, more than two thousand interconnect traces could be required to access them for data alone. When control wires are taken into account, the required number of interconnects increases.

Thus, a need exists for an apparatus and method for accessing numerous large remote registers in an integrated circuit chip while using a minimum of interconnect traces.

By way of background, the Institute of Electrical and Electronics Engineers (IEEE) Standard 1149.1, "Test Access Port and Boundary Scan Architecture," also known as the Joint Test Action Group (JTAG) standard, defines a test access port and boundary scan architecture for digital integrated circuits and for the digital portions of mixed analog/digital integrated circuits. The facilities defined by the JTAG standard seek to provide a solution to the problem of testing assembled printed circuit boards and other products based on complex digital integrated circuits and high-density surface-mounting techniques. Therefore, the standard focuses on a "scan chain" of serially-connected registers, each of which is capable of being coupled to a chip pad. Importantly, the scan chains contemplated by the JTAG standard are accessible only by means of an external device connected to the serial port defined by the standard. In some JTAG implementations, numerous different scan chains have been formed on one chip, and the same external serial port has been used to access the different scan chains using an identifier unique to the scan chain of interest. Nevertheless, in all JTAG implementations, an external serial port is needed. Moreover, the JTAG standard does not contemplate or suggest a general-purpose scheme for individually selecting numerous, large and variable-sized registers distributed throughout an integrated circuit device; for reading and writing such registers individually using a minimum of interconnect traces; and for doing so using microprocessor opcodes as opposed to an external device and a serial port.

SUMMARY OF THE INVENTION

In one embodiment, the invention includes a system of registers implemented on an integrated circuit chip. The system of registers includes a staging register circuitry and a series of remote register circuitries. A serial data line exits the staging register circuitry from a serial data output, propagates through each of the remote register circuitries in the series, and then reenters the staging register circuitry at a serial data input. A control signal line exits the staging register circuitry from a control signal output and propagates through each of the remote register circuitries to the last remote register circuitry in the series. Each of the remote register circuitries contains a remote data register, and a unique address is associated with each of the remote register circuitries in the series. In operation, the staging register circuitry generates a header that indicates which of the remote registers it wishes to read data from or write data to, and also whether it wishes to read or write data from the selected remote register. By using a control line and a serial data line, It propagates this header through the series of remote register circuitries so that each remote register circuitry may determine if it has been selected. When a remote register circuitry determines if it has been selected, it shifts data from its remote register onto the serial data line in the event the header indicated that a read operation was requested, or it shifts data into its remote register in the event the header indicated that a write operation was requested. Each remote register circuitry in the series represents only a one-bit delay in the loop. In this manner, any number of remote registers may be designed into the series without adding undue latency, and only the control line and the serial data line are necessary to interconnect them all. Moreover, the remote registers may be large (on the order of 1,000 bits or more), and may be of different sizes.

In a further embodiment, the staging register circuitry is coupled to a microprocessor general purpose register or registers (on the same chip as the remote registers and the staging register circuitry) via a parallel data path. A set of microprocessor instructions are then used to read from and write to the remote registers distributed throughout the chip. For writes, the data to be written is loaded into a general purpose microprocessor register, and another microprocessor instruction (having as its operand the address of the target remote register) is executed to shift the address and data through the series of remote register circuitries to effect the write. For reads, a microprocessor instruction (having as its operand the address of the desired remote register) is executed to shift a header containing the desired address through the series of remote register circuitries. At the same time, serial data is shifted back into the staging register circuitry. Because the selected remote register will have placed the desired data onto the serial data line in response to the header, the read data will have been clocked into the staging register circuitry on the serial data line at the completion of the read operation.

BRIEF DESCRIPTION OF THE DRAWINGS

The present invention is described herein with reference to the accompanying drawings, like reference numbers being used therein to indicate identical or functionally similar elements.

DETAILED DESCRIPTION OF THE PREFERRED EMBODIMENTS

For a better understanding of the invention, a preferred embodiment will now be described in detail, first structurally and then operationally.

Structure

Figure 1:
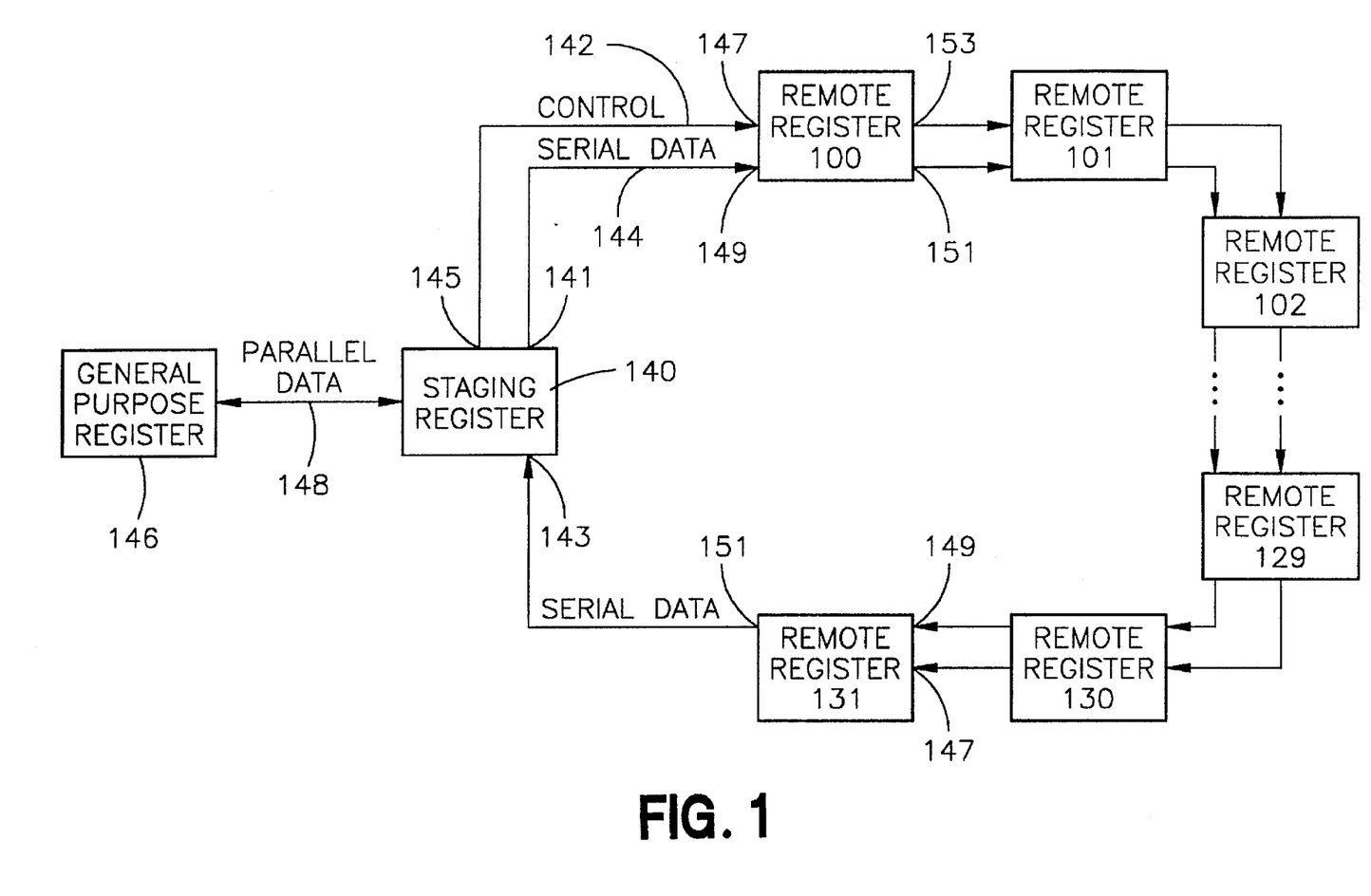
FIG. 1 is a block diagram illustrating a serial loop of remote registers interfaced with a general purpose register on an integrated circuit chip according to a preferred embodiment of the invention.

FIG. 1 illustrates a preferred embodiment of the invention wherein a serial loop is formed by remote register circuitries 100–131 and staging register circuitry 140. Staging register circuitry 140 has a serial data output 141, a serial data input 143, and a control signal output 145. The staging register circuitry control signal output 145 is coupled via control line 142 to a corresponding control signal input 147 of remote register circuitry 100. Likewise, the staging register circuitry serial data output 141 is coupled via serial data line 144 to a corresponding serial data input 149 of remote register circuitry 100. Each of remote register circuitries 100–130 has a serial data input 149, a serial data output 151, a control signal input 147 and a control signal output 153. Remote register circuitry 131 has a serial data input 149, a serial data output 151 and a control signal input 147. Thus, the signal on serial data line 144 may be propagated in serial fashion from the serial data output 141 of staging register 140, through each of remote register circuitries 100–131 and back into the serial data input 143 of staging register circuitry 140. Similarly, the signal on control line 144 may be propagated from the control signal output 145 of staging register circuitry 140 to remote register circuitry 131 through each of the intervening remote register circuitries. Staging register circuitry 140 is coupled to general purpose register circuitry 146 via parallel data bus 148.

It is contemplated that all components shown in FIG. 1 would be implemented on a single integrated circuit chip, such as a microprocessor, and that general purpose register circuitry 146 would correspond, for example, with the general purpose registers of the microprocessor. Moreover, it is contemplated that remote register circuitries 100–131 would be distributed throughout the integrated circuit chip. For example, remote register circuitries 100–131 may contain control registers that are associated with self-diagnostic features of a microprocessor.

Figure 2A:
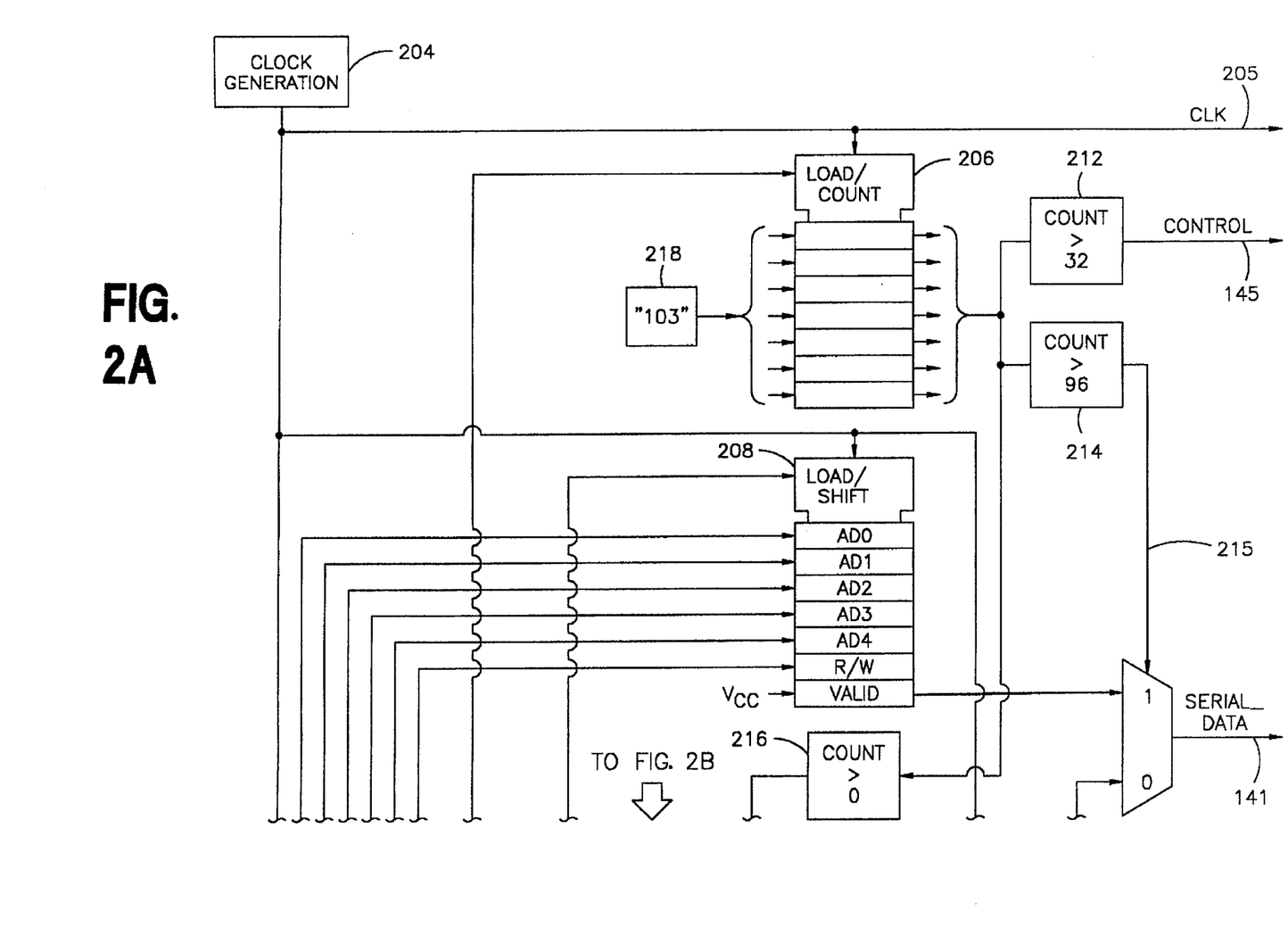
FIG. 2 is a block diagram illustrating in more detail the staging register and general purpose register(s) of FIG. 1 and their associated control logic.
Figure 2B:
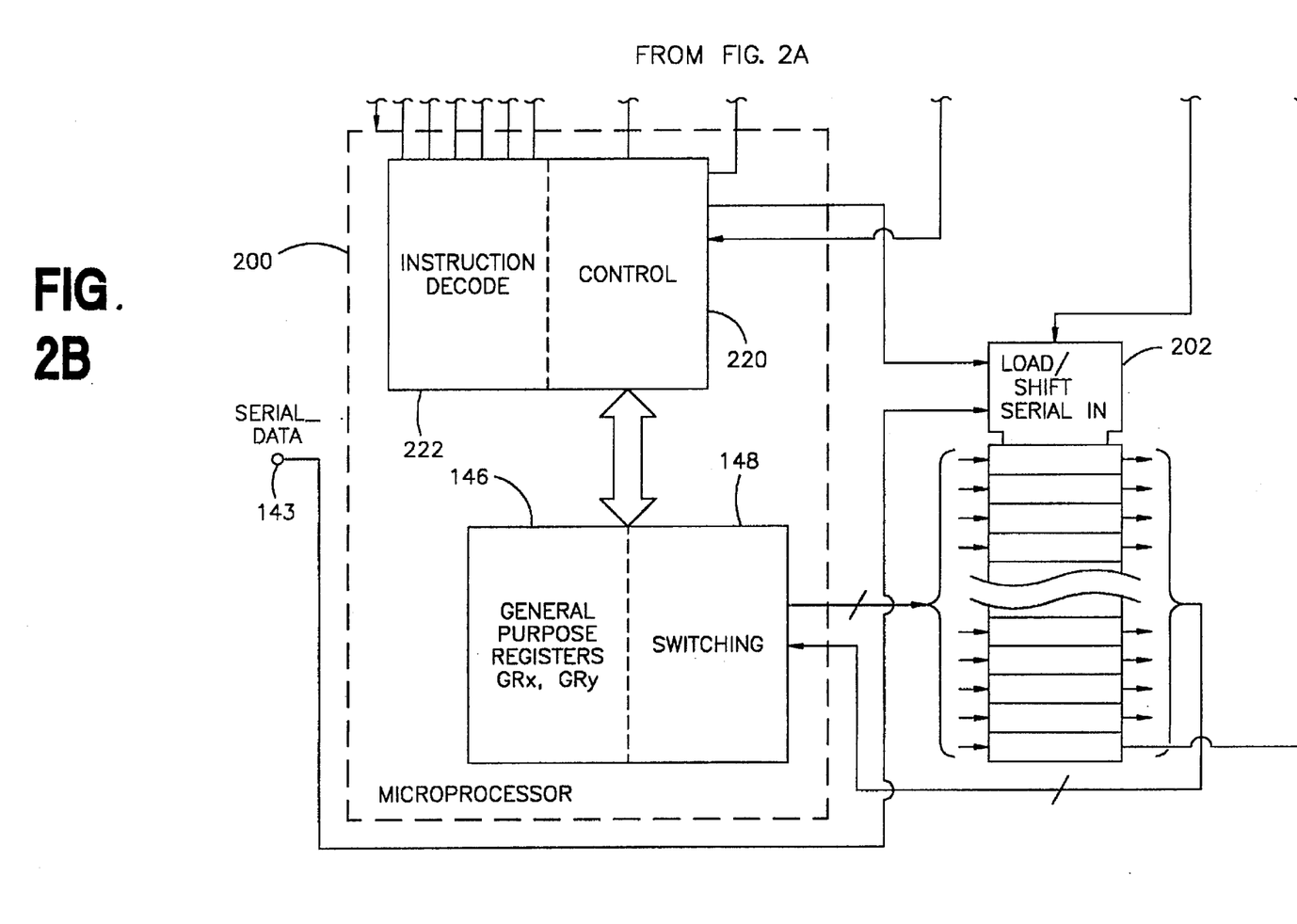

FIG. 2 is a block diagram illustrating staging register circuitry 140 and general purpose register circuitry 146 in more detail. As was discussed above, general purpose register circuitry 146 may be part of a microprocessor 200. It is coupled to staging register 202 via a parallel data bus 148 (shown in FIG. 2 in the form of switching circuitry appropriate for directing read and write data between staging register 202 and one of the general purpose registers within microprocessor 200's general purpose registers 146). Also shown in FIG. 2 is clock generation logic 204, counter 206, header generation register 208, multiplexer 210, comparators 212, 214 and 216, and ROM 218. ROM 218 may be implemented simply as hardwired connections to power supply and ground as required to present the binary equivalent of decimal "103" to the parallel data load inputs of counter 206. Counter 206 should be configured to count down whenever it receives a clock and its control input indicates count. When its control input indicates load, counter 206 will be reset to the value "103." Clock generation logic 204 generates clock signal 205, which may be used to drive clock inputs throughout the chip. Comparator 212 will assert control line 145 whenever the output of counter 206 exceeds decimal 32. Comparator 214 will assert main serial data multiplexer control line 215 whenever the output of counter 206 exceed decimal 96. And comparator 216 will assert a signal to control logic 220 within microprocessor 200 whenever the output of counter 206 exceeds 0. As is indicated in the drawing, the control signals for counter 206, header generation register 208 and staging register 202 may be provided by control logic 220 within microprocessor 200. Also, the parallel data load inputs of header generation register 208 is provided by instruction decode logic 222 within microprocessor 200.

Figure 3A:
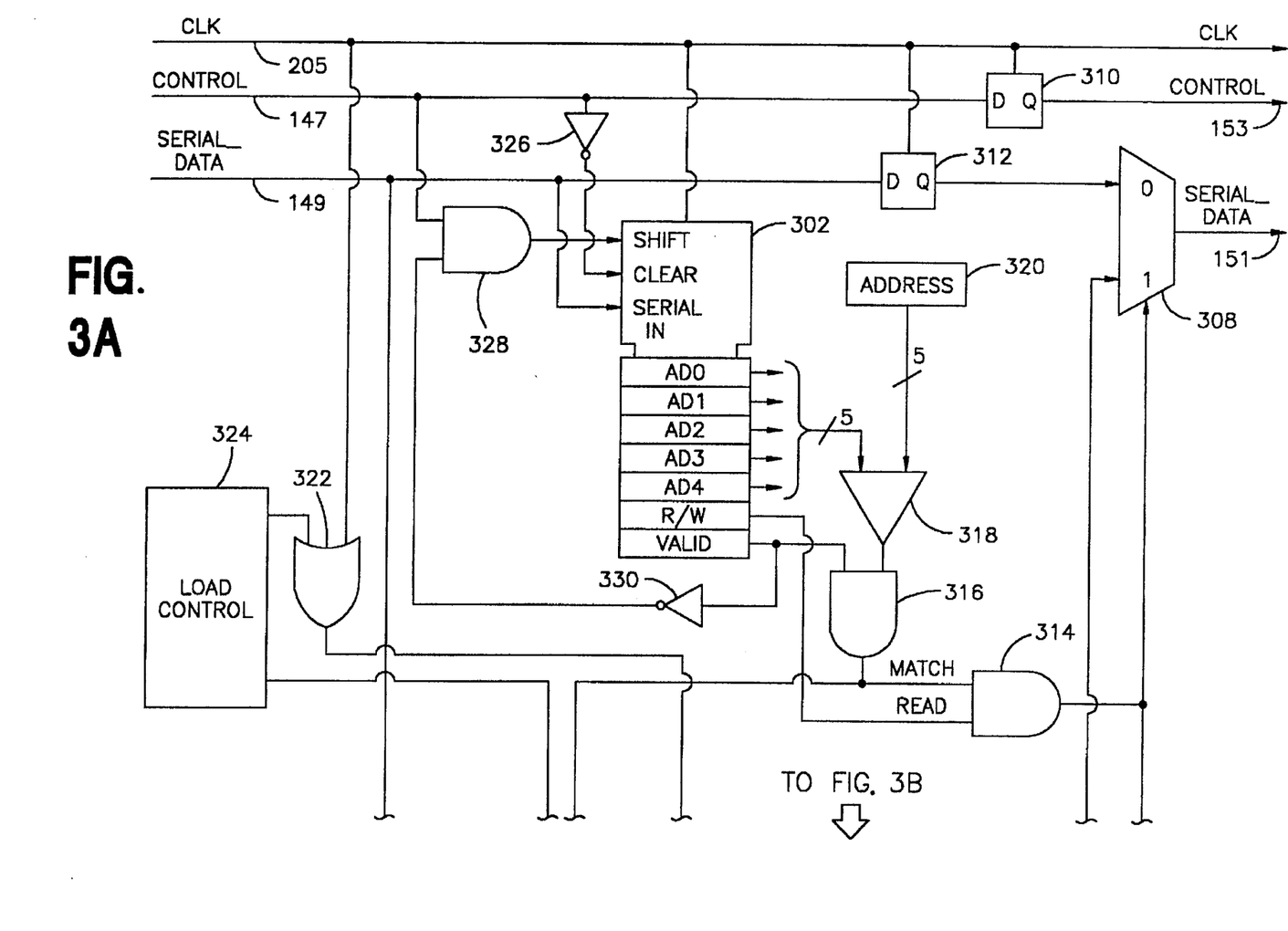
FIG. 3 is a block diagram illustrating in more detail a representative one of the remote registers of FIG. 1 and its associated control logic.
Figure 3B:
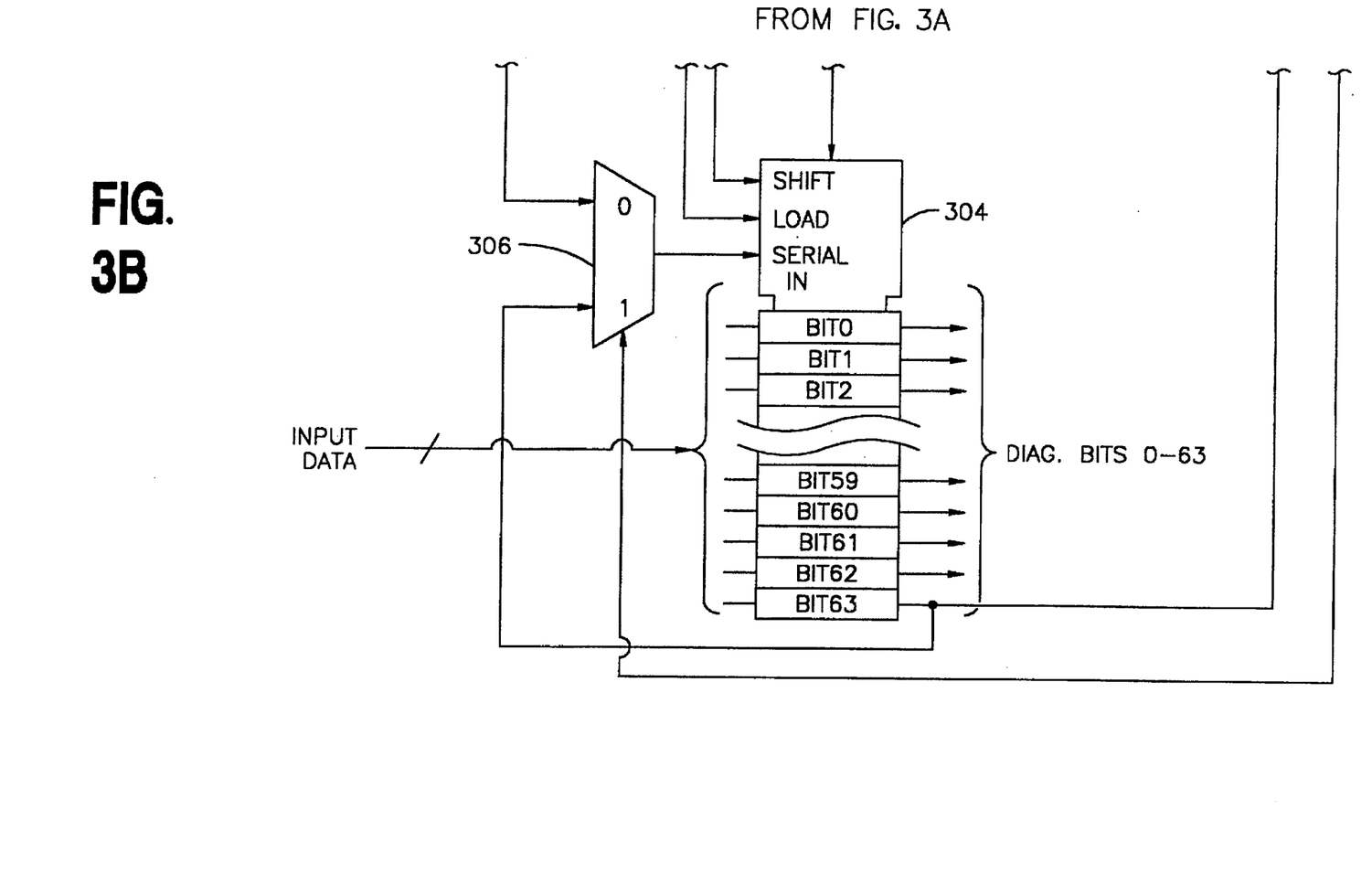

FIG. 3 is a block diagram illustrating remote register circuitry 100 in more detail. (It should be understood that remote register circuitry 100 is representative of all remote register circuitries shown in FIG. 1, with the exception that remote register circuitry 131 does not include a control signal output.) Remote register circuitry 100 includes a header capture register 302, a remote register 304, an input multiplexer 306 and an output multiplexer 308. Control signal input 147 is coupled to control signal output 153 through one-bit latch 310. Serial data input 149 is coupled to one input of output multiplexer 308 through one-bit latch 312. The other input of output multiplexer 308 is coupled to the data shift output of remote register 304. Serial data output 151 is provided by the output of output multiplexer 308. The control input of output multiplexer 308 is provided by the output a combinational logic system comprising AND gates 314 and 316, comparator 318 and ROM 320. ROM 320 stores the address that remote register circuitry 100 will respond to. (Preferably, each of remote register circuitries 100–131 will be configured to respond to a unique address.) Comparator 318 compares this address with bits AD0–4 from header capture register 302 and asserts one input of AND gate 316 if they are the same. A MATCH is indicated on the output of AND gate 316 if the output of comparator 318 is asserted and the VALID bit in header capture register 302 is also asserted. If MATCH is asserted and the R/W bit in header capture register 302 indicates a read, then the output of AND gate 314 will be asserted and the "1" inputs of both multiplexers 308 and 306 will be selected; otherwise, the "0" inputs of those multiplexers will be selected. OR gate 322 and load control logic 324 are provided to enable input data to be loaded into remote register 304 whenever desired. For example, load control logic 324 may be part of a self-diagnostic system in a microprocessor, and may be programmed to capture certain input data in response to a trigger, and to store this input data in remote register 304 for later retrieval by means of the method and apparatus of the present invention. Alternatively, remote register 304 may constitute a control register for use with such a self-diagnostic system. In the latter case, the method and apparatus of the present invention would be used to load control values into remote register 100 from time to time as appropriate to operate the self-diagnostic system (thus the nomenclature "diagnostic bits 0–63" shown in the drawing at the output of remote register 304).

Serial data input 149 is coupled to the "0" input of input multiplexer 306 and to the serial input of header capture register 302. The serial input of remote register 304 is coupled to the output of input multiplexer 306. The shift input of remote register 304 is coupled to the MATCH signal, while its load input is supplied by load control logic 324. Control input 147 is coupled to a clear input of header capture register 302 via inverter 326. The shift input of header capture register 302 is driven by the output of AND gate 328, whose first input is coupled to the control input 147, and whose second input is coupled to the VALID bit through inverter 330.

Operation

It is contemplated that microprocessor 200 will include within its instruction set certain opcodes for writing data to and reading data from specific remote registers. For example, one instruction may be designed to move the contents of a specified general purpose register into staging register 202. Another instruction may be designed to load header generation register 208 with the address of the desired remote register, to set the R/W bit in header generation register 208 to "R" in the case of a read or to "W" in the case of a write, and to shift the header out onto serial data line 144. A third instruction might be designed to move the contents of staging register 202 into a specified general purpose register.

For the purpose of the examples to follow, it will be assumed that staging register 202 and all of the remote registers 304 are sixty-four bits in length. It should be noted, however, that in other implementations of the invention the staging register need not be the same length as the remote registers. Moreover, the remote registers need not all be the same length as one another. Multiple operations may be used to read and write remote registers that are longer than the staging register.

Figure 4:
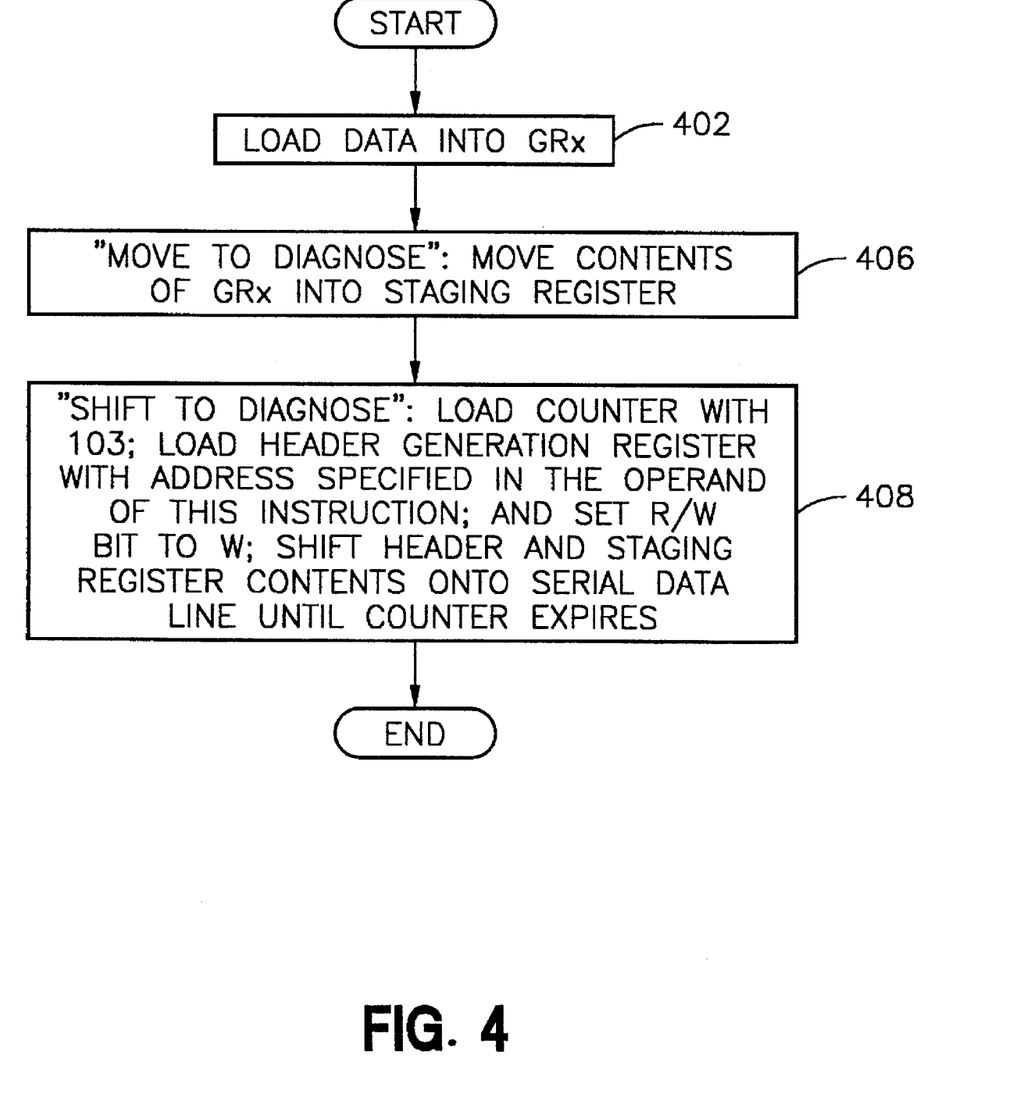
FIG. 4 is a flow diagram illustrating a preferred method for writing data to a remote register according to the invention.

Writing to a Remote Register FIG. 4 illustrates a preferred method for writing a data value to a remote register using the apparatus of the invention. In step 402, a microprocessor instruction is executed to load the data into general purpose register GRx. In step 406, using another microprocessor instruction, the contents of GRx are loaded into staging register 202. In step 408, a "shift to diagnose" instruction is executed. This instruction should contain the address of the target remote register as immediate information. The effect of the instruction is to load the address into bits AD0–4 of header generation register 208, and to set the R/W bit of that register to W. (The VALID bit in header generation register 208 always loads with VALID.) Then, after loading counter 206 with the number 103, the contents of header generation register 208 and staging register 202 are shifted onto serial data line 144 by supplying appropriate control signals to the two registers. The shifting ceases when counter 206 counts down to zero.

Figure 5:
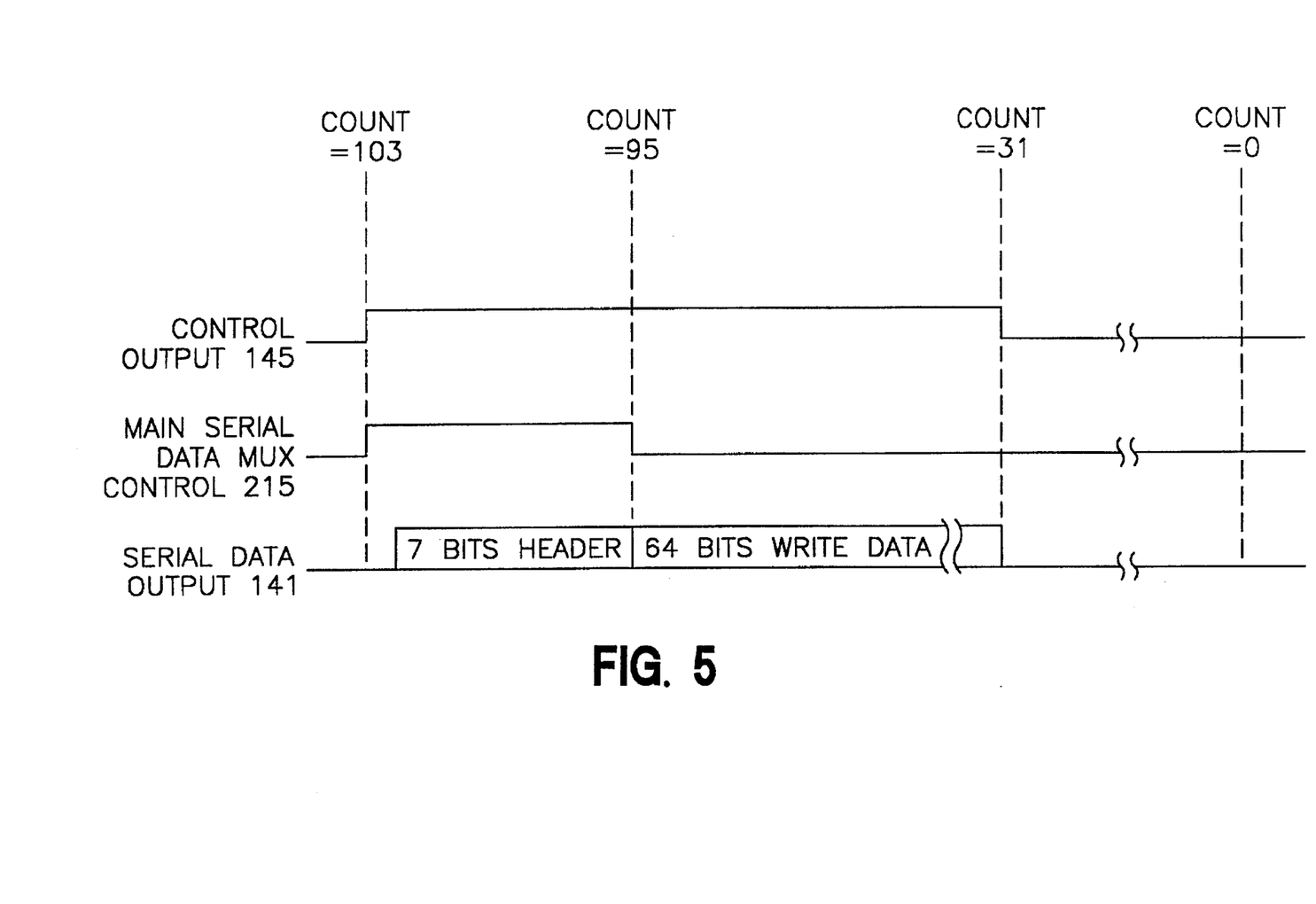
FIG. 5 is a timing diagram illustrating the states of control output 145, main serial data multiplexer control line 215, and serial data output 141 during a write to a remote register.

Because, when initially loaded, the value in counter 206 exceeds both 32 and 96, control signal 142 and multiplexer control line 215 are both asserted (as indicated at COUNT= 103 in FIG. 5). Thus, main serial data multiplexer 210 routes the serially shifting output from header generation register 208 onto serial data line 144. As soon as the seven header bits from header generation register 208 have been shifted onto serial data line 144, the count in counter 206 will have fallen to 95. At this time, main serial data multiplexer control line 215 is unasserted (as shown at COUNT=95 in FIG. 5). Thus, the data from staging register 202 is selected and begins to be shifted serially out onto serial data line 144. At the same time, data from serial data input 143 is shifted serially into staging register 202. Although the write data will have been completely shifted out of staging register 202 when COUNT=31 (as shown in FIG. 5), the write operation continues for several additional clock cycles until COUNT= 0. This is necessary because each of remote register circuitries 100–131 interposes a one-bit latch on serial data line 144 and on control line 142. In the example being discussed, there are 32 remote registers. Thus, 32 additional shifts are necessary to assure that all bits are communicated to the 32nd remote register in the serial loop before shifting ceases.

Activity at the remote registers can best be understood with reference to FIG. 3. It can be seen that header capture register 302 will have been cleared while CONTROL was unasserted. When CONTROL is asserted, header capture register will begin clocking bits in serially from serial data input 149. As soon as the VALID bit is clocked in, the shift input is disabled and no further shifting occurs in header capture register 302. Instantaneously, a comparison is then made with address 320. If the address matches the header address bits, then remote register 304 begins clocking bits in serially from serial data input 149 until CONTROL is no longer asserted. The result will be that 64 data bits will have been written into remote register 304.

Reading a Remote Register Reading data from a particular remote register is very similar procedurally to writing data to the register, except that microprocessor 200 sets the R/W bit in header generation register 208 to R, and need not load any data value into staging register 202 before executing the read operation.

Figure 6:
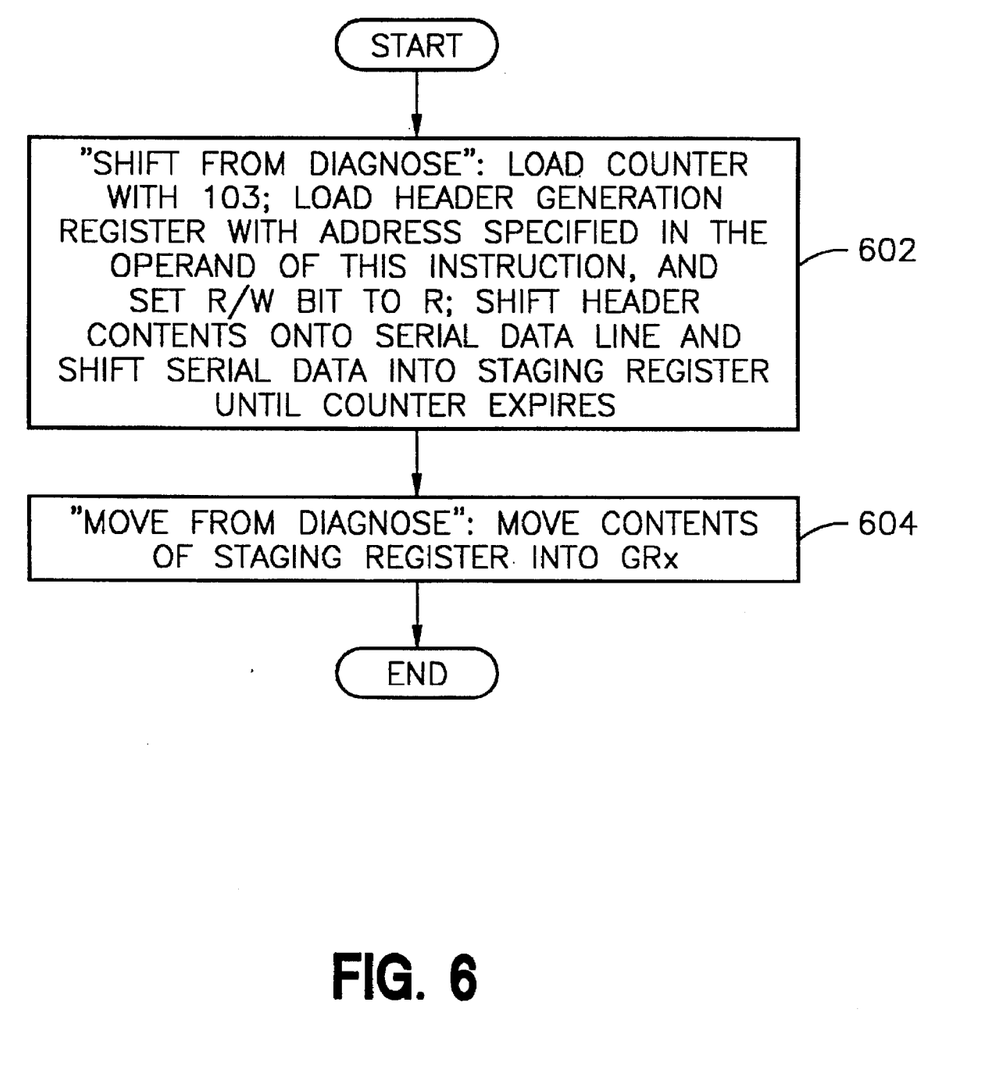
FIG. 6 is a flow diagram illustrating a preferred method for reading data from a remote register according to the invention.
Figure 7:
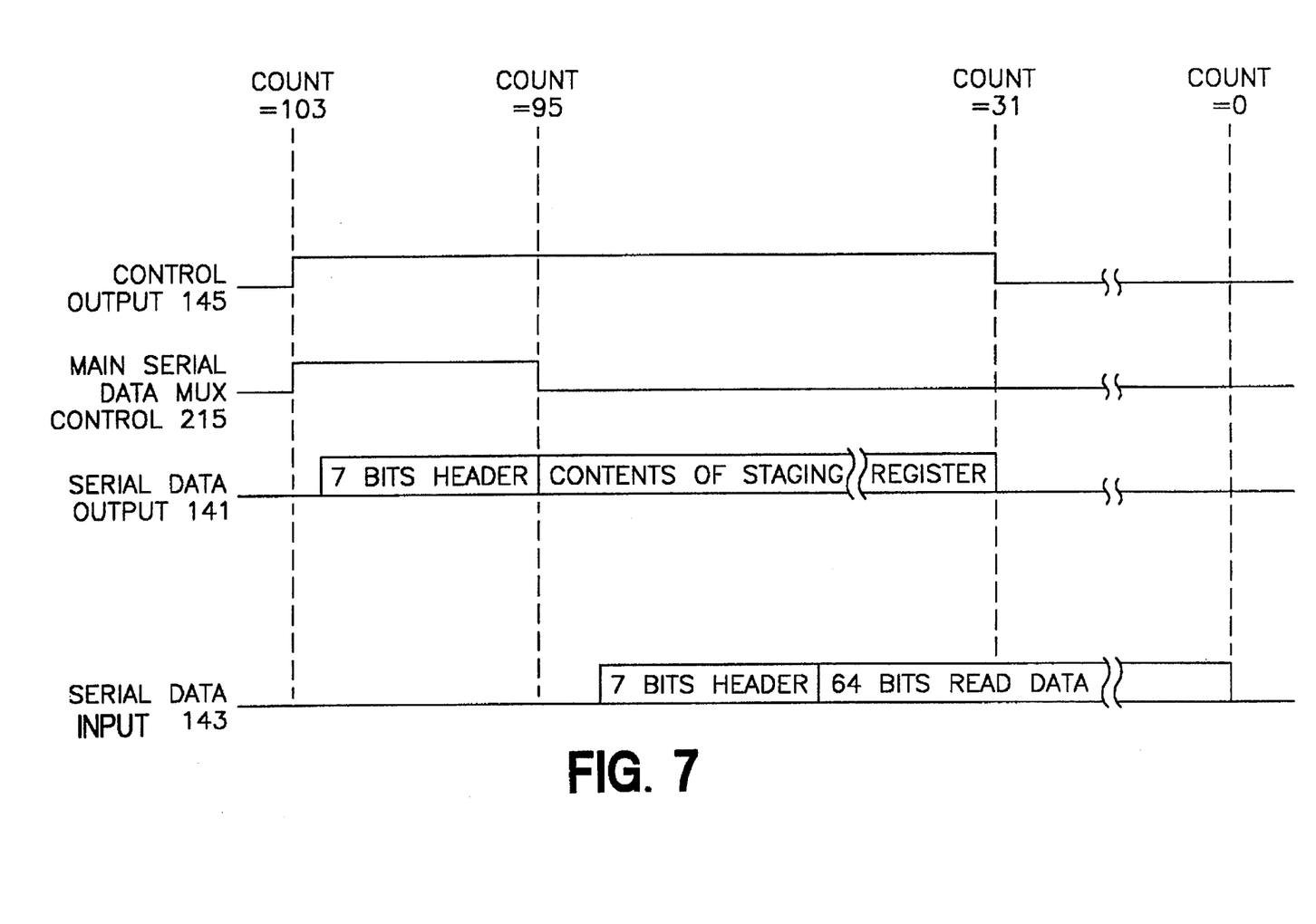
FIG. 7 is a timing diagram illustrating the states of control output 145, main serial data multiplexer control line 215, serial data output 141 and serial data input 143 during a read from a remote register.

FIG. 6 illustrates a preferred method for reading data from a remote register using the apparatus of the invention. In step 602, a "shift to diagnose" instruction is executed to load counter 206 with 103, load address bits AD0–4 of header generation register 208 with the address specified in the instruction, and set the R/W bit of that register to "R." The header is then shifted out onto serial data line 144, and at the same time serial data is shifted back into staging register 202 from serial data input 143. The shifting ceases when counter 206 counts down to zero. As can be seen in FIG. 7, the 32-bit latency caused by the latches in the serial loop of remote register circuitries causes the last of the read data to be clocked into staging register 202 from serial data input 143 when COUNT=0.

As the header is propagated through the loop of remote register circuitries 100–131, each of the remote register circuitries compares bits AD0–4 in the header with its own address to determine if it has been selected. If the addresses are the same, then MATCH is asserted. The R/W having been set to R causes READ also to be asserted. The result is that multiplexer 308 routes data from remote register 304 onto serial data line 144, enabling the data to be shifted serially back into serial data input 143 of staging register circuitry 140 as desired. The control inputs of remote register are also controlled so that data shifted out of the register is recirculated to the serial input, thus making non-destructive reads possible if the remote register is either 64 bits long or an evenly divisible submultiple of 64.

The present invention provides important advantages over the methods and apparatus of the prior art. For example, remote registers used in implementations of the invention can be quite large (on the order of 1,000 bits or more) and very numerous, and yet only two interconnect lines are necessary to access all of them. Also, the apparatus of the invention can be expanded to include many more or less than the 32 remote registers used in the example discussed herein, simply by adding to or subtracting from the number of bits used in the header address field (bits AD0-4). Moreover, addition of a remote register, no matter its size, adds only one bit of latency to the serial loop. This is because unselected remote registers are effectively bypassed by the apparatus of the invention.

While the present invention has been described in detail in relation to a preferred embodiment thereof, the described embodiment has been presented by way of example and not by way of limitation. It will be understood by those skilled in the art that various changes may be made in the form and details of the described embodiment, resulting in equivalent embodiments that remain within the scope of the appended claims.

What is claimed is:

1. A system of registers implemented on an integrated circuit chip, comprising:

a staging register circuitry having a staging register circuitry control signal output, a staging register circuitry serial data output, and a staging register circuitry serial data input;

a series of remote register circuitries, each remote register circuitry in said series having at least one data latch for propagating data from a remote register circuitry serial data input to a remote register circuitry serial data output, and each remote register circuitry in said series having at least one control signal latch for propagating a control signal from a remote register circuitry control signal input to a remote register circuitry control signal output;

a serial data line exiting said staging register circuitry at said staging register circuitry serial data output, propagating through each of said remote register circuitries in said series and reentering said staging register circuitry at said staging register circuitry serial data input; and a control signal line exiting said staging register circuitry at said staging register circuitry control signal output and propagating through each of said remote register circuitries in said series.

2. A system of registers according to claim 1, wherein said staging register circuitry further comprises:

header generation circuitry for propagating information on said control signal and serial data lines to select at least one of said remote register circuitries;

and wherein each of the remote register circuitries in said series further comprises:

a remote register; and header capture circuitry for determining, responsive to information propagated on said control signal and serial data lines, whether it has been selected.

3. A method of writing data to one remote register out of a group of remote registers in an integrated circuit chip using a minimum of interconnect lines, said method comprising the steps of:

associating a unique address with each remote register in said group of remote registers;

loading said data into a staging register;

serially shifting, onto a serial data line coupled to each remote register in said group of remote registers, header bits corresponding to the address of the remote register sought to be written;

serially shifting, onto said serial data line, said data from said staging register;

at each remote register in said group of remote registers, determining whether the address in the header bits corresponds to the unique address associated with this remote register and, if so, shifting said data from said serial data line into this remote register.

4. A method of reading data from one remote register out of a group of remote registers in an integrated circuit chip using a minimum of interconnect lines, said method comprising the steps of:

associating a unique address with each remote register in said group of remote registers;

serially shifting, onto a serial data line coupled to each remote register in said group of remote registers, header bits corresponding to the address of the remote register sought to be written;

at each remote register in said group of remote registers, determining whether the address in the header bits corresponds to the unique address associated with this remote register and, if so, shifting the data from this remote register onto said serial data line; and shifting the data from said serial data line into a staging register.

* * * * *